(12) United States Patent
Li et al.

(10) Patent No.: US 11,634,319 B2
(45) Date of Patent: Apr. 25, 2023

(54) DEVICE AND METHOD FOR MONITORING SURFACE CONDITION OF CONTACT SURFACE OF DETECTED OBJECT

(71) Applicant: National Taiwan University, Taipei (TW)

(72) Inventors: Wei-Chang Li, Taipei (TW); Chun-Pu Tsai, Taipei (TW); Hsuan-Wei Wang, Taipei (TW)

(73) Assignee: National Taiwan University, Taipei (TW)

( * ) Notice: Subject to any disclaimer, the term of this patent is extended or adjusted under 35 U.S.C. 154(b) by 380 days.

(21) Appl. No.: 17/113,109

(22) Filed: Dec. 7, 2020

(65) Prior Publication Data
US 2022/0002148 A1 Jan. 6, 2022

Related U.S. Application Data

(60) Provisional application No. 63/047,910, filed on Jul. 2, 2020.

(51) Int. Cl.
*B81B 7/02* (2006.01)
*G01P 15/125* (2006.01)

(52) U.S. Cl.
CPC .............. *B81B 7/02* (2013.01); *G01P 15/125* (2013.01); *B81B 2201/0221* (2013.01); *B81B 2201/0228* (2013.01); *B81B 2203/0136* (2013.01)

(58) Field of Classification Search
CPC .............. B81B 7/02; B81B 2201/0221; B81B 2201/0228; B81B 2203/0136; B81C 99/005; G01P 15/125
See application file for complete search history.

(56) References Cited

U.S. PATENT DOCUMENTS 6,374,677 B1 * 4/2002 Berlin ................. H03H 9/2405
73/662
7,797,998 B2 * 9/2010 Menard ................ G01P 15/125
73/514.32
(Continued)

FOREIGN PATENT DOCUMENTS

AU  2013274681 A1 *  2/2015  ........... B81B 3/0051
CN       104569494          4/2015
(Continued)

OTHER PUBLICATIONS

Shih-Chuan Lu et al., "Surface Condition Influence on the Nonlinear Response of MEMS CC-Beam Resoswitches," IEEE Electron Device Letters, vol. 39, Issue 10, Oct. 17, 2018, pp. 1600-1603.

*Primary Examiner* — Francis C Gray
(74) *Attorney, Agent, or Firm* — JCIPRNET

(57) ABSTRACT

A surface monitoring device is for monitoring a contact surface of a detected object. The surface monitoring device and the detected object are disposed on a substrate. The surface monitoring device includes a resonant mechanical part, having a contact tip adjacent to the contact surface by a preset gap in a static state. A driving circuit, applying an AC input signal to drive the resonant mechanical part to cause the contact tip to vibrate with respect to the contact surface at a plurality of sampling frequencies. The contact tip substantially hits the contact surface in a tapping bandwidth within the sampling frequencies. An analysis circuit to analyze a ratio of an output voltage to an input voltage of the input signal and determine the tapping bandwidth, wherein the ratio in the tapping bandwidth is jumping to a flatten phase.

20 Claims, 3 Drawing Sheets

(56) References Cited

U.S. PATENT DOCUMENTS

| | | |
|---|---|---|
| 8,215,151 B2 | 7/2012 | Sammoura et al. |
| 9,335,396 B2* | 5/2016 | Debeurre ............. G01R 35/005 |
| 10,557,827 B2* | 2/2020 | Younis ............... H01H 59/0009 |
| 2007/0090902 A1 | 4/2007 | Deligianni et al. |
| 2009/0145230 A1* | 6/2009 | Ikeuchi ................. G01P 15/125 |
| | | 73/514.32 |

FOREIGN PATENT DOCUMENTS

| | | | | |
|---|---|---|---|---|
| CN | 105684113 A | * | 6/2016 | ............ B81B 7/008 |
| JP | H10511176 A | * | 10/1998 | |
| KR | 20160124697 A | * | 10/2016 | |
| TW | I247114 | | 1/2006 | |
| TW | 201014782 | | 4/2010 | |

* cited by examiner

DEVICE AND METHOD FOR MONITORING SURFACE CONDITION OF CONTACT SURFACE OF DETECTED OBJECT

CROSS-REFERENCE TO RELATED APPLICATION

This application claims the priority benefit of U.S. Provisional Application No. 63/047,910, filed on Jul. 2, 2020. The entirety of the above-mentioned patent application is hereby incorporated by reference herein and made a part of this specification.

BACKGROUND OF THE INVENTION

Field of the Invention

The invention relates to a technology for fabricating micro-electro-mechanical-system (MEMS) device, in particular, to device and method for monitoring a surface condition of a contact surface of a detected object.

Description of Related Art

The MEMS technology has been greatly developed and commonly applied to various apparatus to perform more intelligent functions. In an example, the MEMS inertial sensor is used in a personal apparatus for detecting the motion event.

In semiconductor fabrication technologies, the MEMS device is fabricated with extremely clean microstructure surfaces. Undesirably, extremely clean microstructure surfaces often stick together if they come into contact. When the surfaces remain stuck together, the device often is inoperable. This concept of surface sticking is known in the art as "stiction."

A number of different factors can contribute to stiction. For example, among other things, stiction may occur during wet release of a movable MEMS microstructure, where the surface tension of a draining rinse liquid can draw the microstructure into contact with an adjacent part such as an underlying substrate (sometimes referred to as "release stiction"). Stiction also may occur when the device is in use, for example, when parts intentionally or accidentally come into contact with one another (sometimes referred to as "in-use stiction").

It is necessary to well monitor the contact surface of a detected object such as MEMS device, to assure the normal performance of the MEMS device. A surface monitoring device would be involved with the MEMS device.

SUMMARY OF THE INVENTION

The invention provides a surface monitoring mechanism to effectively monitor the surface condition of a contact surface of a detected object, such as a MEMS sensor or a MEMS inertial sensor. Even further, the aging effect of the contact surface of the detected object may also be well monitored.

In an embodiment, the invention provides a surface monitoring device for monitoring a contact surface of a detected object. The surface monitoring device and the detected object are disposed on a substrate. The surface monitoring device includes a resonant mechanical part, having a contact tip adjacent to the contact surface by a preset gap in a static state. A driving circuit, applying an AC input signal to drive the resonant mechanical part to cause the contact tip to vibrate with respect to the contact surface at a plurality of sampling frequencies. The contact tip substantially hits the contact surface in a tapping bandwidth within the sampling frequencies. An analysis circuit to analyze a ratio of an output voltage to an input voltage of the input signal and determine the tapping bandwidth, wherein the ratio in the tapping bandwidth is jumping to a flatten phase.

In an embodiment, the invention also provides a method for monitoring a contact surface of a detected object. The method comprises providing a surface monitoring device. The surface monitoring device and the detected object are disposed on a substrate. The surface monitoring device as provided includes: providing a resonant mechanical part, having a contact tip adjacent to the contact surface by a preset gap in a static state. In addition, a driving circuit is provided for applying an input signal of alternating current (AC) to drive the resonant mechanical part to cause the contact tip to vibrate with respect to the contact surface at a plurality of sampling frequencies, wherein the contact tip substantially hits the contact surface in a tapping bandwidth within the sampling frequencies. An analysis circuit is provided to analyze a ratio of an output voltage to an input voltage of the input signal and determine the tapping bandwidth, wherein the ratio in the tapping bandwidth is jumping to a flatten phase. The method also monitors the tapping bandwidth to determine a change of the contact surface in physical property.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to a surface monitoring mechanism to effectively monitor the surface condition of a contact surface of a detected object, such as a MEMS sensor or a MEMS inertial sensor.

Several embodiments are provided for describing the invention but the invention is not just limited to the embodiments as provided.

Figure 1:
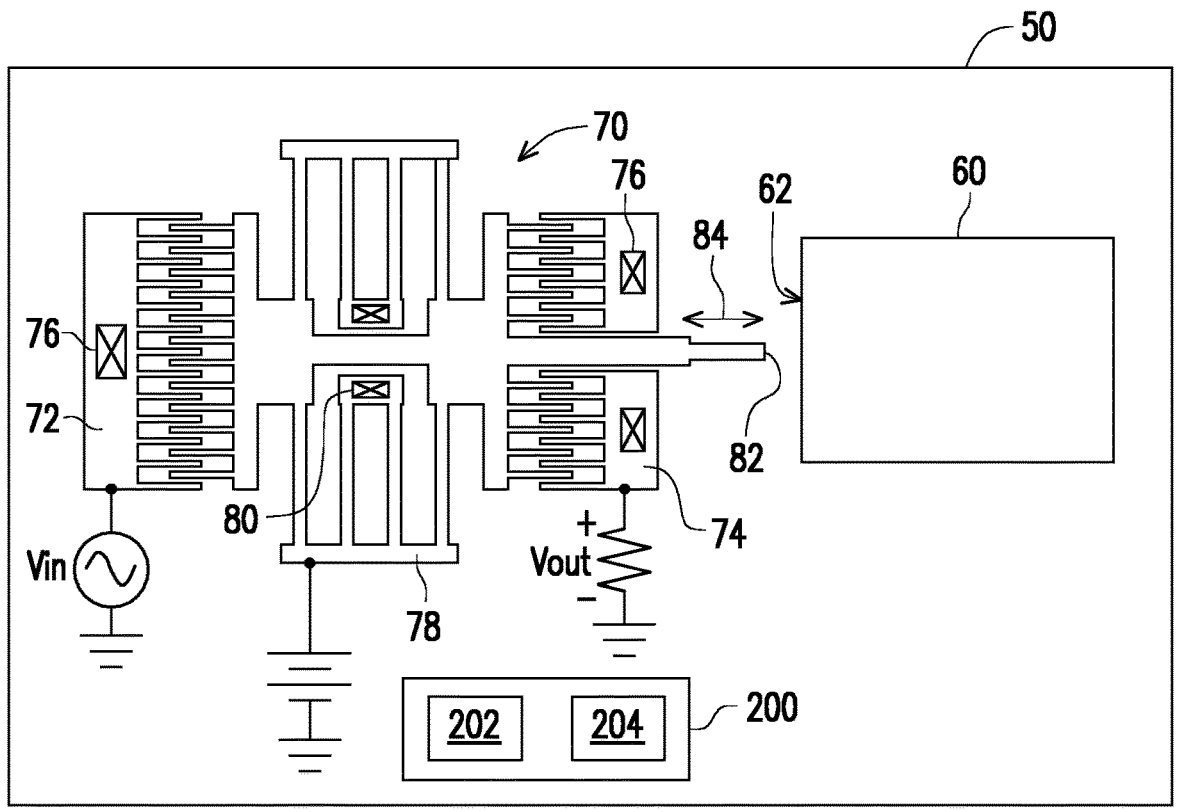
FIG. 1 is a drawing, schematically illustrating an implementation of a surface monitoring device for monitoring a contact surface of a detected object at a top view, according to an embodiment of the invention.

FIG. 1 is a drawing, schematically illustrating an implementation of a surface monitoring device for monitoring a contact surface of a detected object at a top view, according to an embodiment of the invention.

Referring to FIG. 1, a detected device 60 and a surface monitoring device 70 are formed on a substrate 50. The whole device with the substrate 50 may be implemented to a functional apparatus, such as an intelligent apparatus, personal apparatus or a cellular phone. The detected device 60 in an example may be a sensing device, such as a MEMS device or MEMS inertial sensor but without specific limitation.

The surface condition of the detected device 60 may need to be monitored to determine the normal performance of the detected device 60, such as the MEMS inertial sensor. The surface monitoring device 70 is then implemented together with the detected device 60. The surface monitoring device 70 is also a MEMS device, fabricated together with the detected device 60 on the substrate 50.

A contact tip 82 of the surface monitoring device 70 is distance from a contact surface 62 of the detected device 60 by a preset gap. However, in operation of the surface monitoring device 70, the contact tip 82 would vibrate with respect to the contact surface 62 in a back-and-forth direction 84. The vibrating amplitude may be controlled by a resonant in accordance with the frequency of an AC signal as to be described later in FIG. 4 and FIG. 5. Then, the contact tip 82 would hit the contact surface 62 inducing a resonant state. However, when the frequency as applied to the surface monitoring device 70 is over large, the vibrating magnitude of the contact tip 82 would reduce again and the contact tip 82 does not hit the contact surface 62, again. The surface monitoring device then may be used to detect the surface condition of the detected device.

The implementation of the surface monitoring device 70 is described before describing the monitoring mechanism. The surface monitoring device 70 in an embodiment may include a resonant mechanical part having a fixed part 72, 74 and a vibrating part 78. In addition, an operation circuit 200 may be included for detection. The operation circuit 200 in an embodiment includes a driving circuit 202 and an analysis circuit 204. As noted, the implementation of the operation circuit 200 may be on the substrate 50 or an external circuit without specific limitation.

In an embodiment, the fixed part 72 is fixed to the substrate 50 by the anchor 76. The fixed part 72 is an electrode with a comb-like structure. The vibrating part 78 is another electrode having the comb-like structure, which are held by an elastic structure or a spring structure. The vibrating part 78 is also disposed on the substrate by the anchor 80. The elastic structure of vibrating part 78 allows the comb-like structure to be vibrating at the back-and-forth direction 84. A contact tip 82 is included in the vibrating part 78 to hit the contact surface 62 of the detected device 60 under operation.

In operation, the comb-like structure of the fixed part 72, 74 and the comb-like structure of the vibrating part 78 are formed into an interdigital electrode, which is a capacitor as viewed in an equivalent circuit.

In an embodiment, the driving circuit 202 may apply the input signal Vin, which is an AC signal, to the fixed part 72 while an output voltage Vout may be measured by analysis circuit 204. In the embodiment, the vibrating part 78 may be grounded. In an embodiment, the output current may flow through a resistor to convert into bias as the output voltage Vout.

As noted, to induce the resonant between the fixed part 72, 74 and the vibrating part 78, which form a capacitor, the AC input signal Vin may be input to the vibrating part 78 and the output signal Vout is measured from the fixed part 72. In other words, the equivalent resonant circuit may be set up according to the option as taken as viewed from the equivalent circuit. The voltages applied to the surface monitoring device 70 have various ways without limiting to the embodiments as provided.

Figure 2:
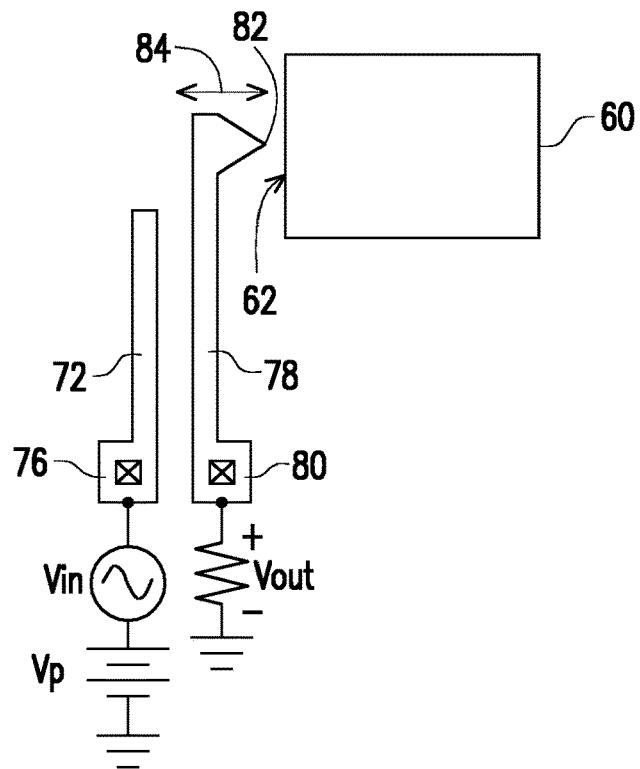
FIG. 2 is a drawing, schematically illustrating an implementation of a surface monitoring device for monitoring a contact surface of a detected object at a top view, according to an embodiment of the invention.
Figure 3:
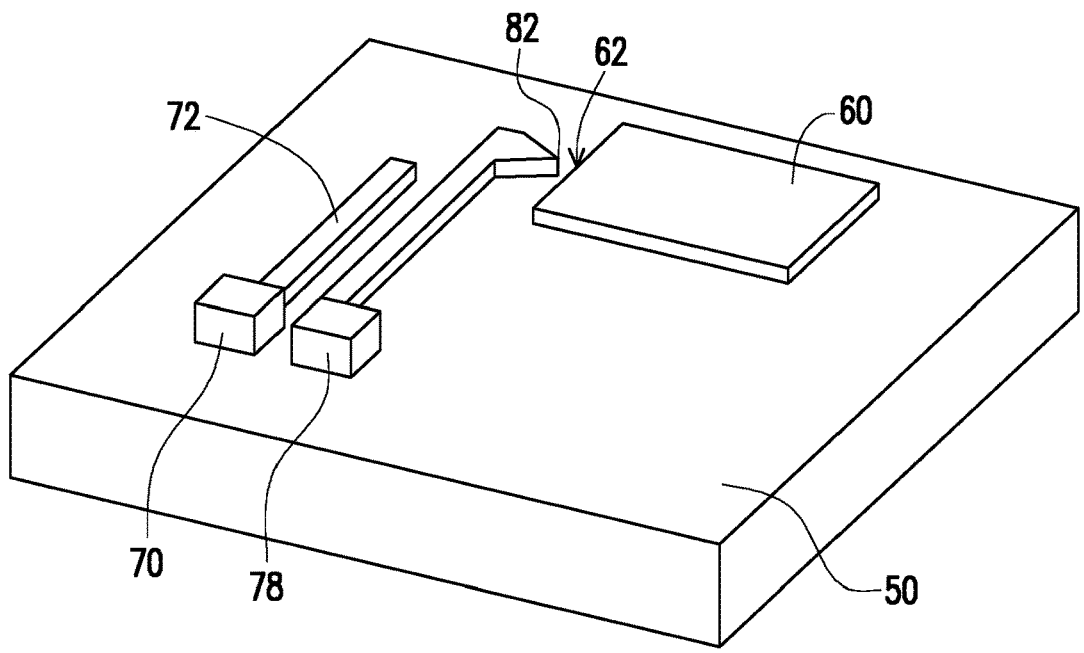
FIG. 3 is a drawing, schematically illustrating an implementation an apparatus with a surface monitoring device for monitoring a contact surface of a detected object at a perspective view of FIG. 2, according to an embodiment of the invention.

With the same design concept, the surface monitoring device in FIG. 1 may have another design. FIG. 2 is a drawing, schematically illustrating an implementation of a surface monitoring device for monitoring a contact surface of a detected object at a top view, according to an embodiment of the invention. FIG. 3 is a drawing, schematically illustrating an implementation an apparatus with a surface monitoring device for monitoring a contact surface of a detected object at a perspective view of FIG. 2, according to an embodiment of the invention.

Referring to FIG. 2 and FIG. 3, the fixed part 72 and the vibrating part 78 of the surface monitoring device 70 may be modified. In an embodiment, the fixed part 72 may include a beam structure, which may be firmly disposed on the substrate 50. However, depending on the actual need, the anchor 76 may also be included. The vibrating part 78 with the contact tip 82 in an embodiment is also a beam structure but is an elastic state for vibrating. In this situation, the vibrating part 78 is suspending over the substrate 50 but an end is fixed to the substrate 50 by the anchor 80. In this structure, a capacitor is formed between the vibrating part 78 and the fixed part 72. The contact tip 82 may move at the back-and-forth direction 84 to hit the contact surface 62 of the detected device 60. In an embodiment, the AC input signal Vin is applied to the fixed part 72. Due to AC signal on the equivalent capacitor, the vibrating part 78 would be vibrating or oscillating. Then, the contact tip 82 would hit the contact surface 62 when the frequency is at the resonant status with sufficient amplitude.

In the invention, the parameter of a ratio of the output voltage Vout to the input voltage Vin as expressed by $$\left|\frac{Vout}{Vin}\right|$$

is monitored as the frequency of the input voltage Vin is varying from low to high.

Figure 4:
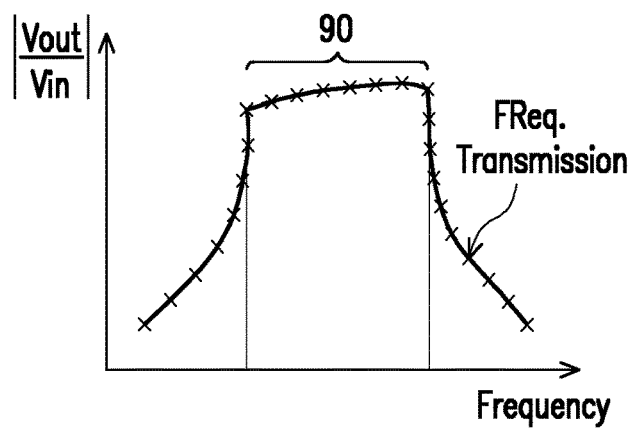
FIG. 4 is a drawing, schematically illustrating the monitoring mechanism to determine a tapping bandwidth, according to an embodiment of the invention.

FIG. 4 is a drawing, schematically illustrating the monitoring mechanism to determine a tapping bandwidth, according to an embodiment of the invention. Referring to FIG. 4, a plurality of sampling frequencies for the input signal Vin with same voltage amplitude are applied to the surface monitoring device. The ratio of $$\left|\frac{Vout}{Vin}\right|$$

is checked by the analysis circuit 204 in relating to the frequency of the input signal Vin. In an embodiment, as looked into in the invention, a frequency transmission line is obtained, in which the cross points are the sampling frequency points be actually measured. In the invention, the tapping region 90 occurs in the distribution of $$\left|\frac{Vout}{Vin}\right|.$$

As looking into, me contact tip 82 starts to hit the contact surface 82 within the tapping region 90 with the surface condition of the contact surface 62. In the first stage of the frequency transmission line, of the contact tip 82 still not contacting to the contact surface. Depending on the surface condition, the ratio $$\left|\frac{Vout}{Vin}\right|$$

would rather suddenly jump to another status, which defines the start frequency of the tapping region 90. The frequency of the input signal Vin keeps on increasing and may be over the resonant frequency peak, the contact tip 82 then does not contact to the contact surface 62. The ratio $$\left|\frac{Vout}{Vin}\right|$$

again suddenly jumps to the usual falling stage.

The frequent width of the tapping region 90 is also call as tapping bandwidth. The tapping bandwidth would change in size when the surface condition of the contact surface 62 is changed. The invention proposes the surface monitoring device for detecting the ratio $$\left|\frac{Vout}{Vin}\right|,$$

so as to obtain the tapping bandwidth to determine how the surface condition is changed. However, the ratio $$\left|\frac{Vout}{Vin}\right|$$

and the tapping bandwidth as proposed in the invention may be applied for any subsequent application without limiting to a specific use.

Figure 5:
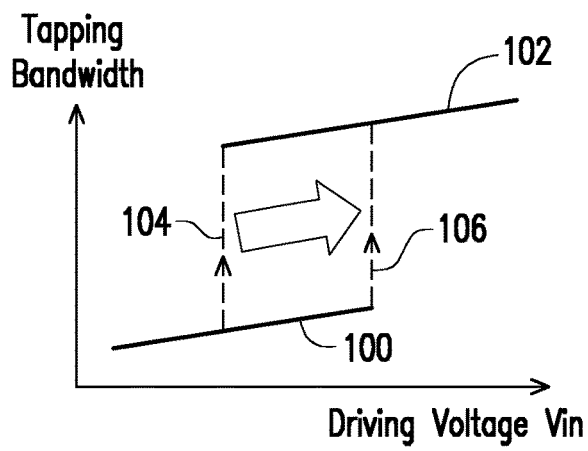
FIG. 5 is a drawing, schematically illustrating the monitoring mechanism to observe an aging effect based on the tapping bandwidth, according to an embodiment of the invention.

Further, based the measurement of the tapping bandwidth for the tapping region 90, the invention may also monitor the aging effect of the contact surface 62. FIG. 5 is a drawing, schematically illustrating the monitoring mechanism to observe an aging effect based on the tapping bandwidth, according to an embodiment of the invention.

Referring to FIG. 5, based on the tapping bandwidth of the tapping region 90 as obtained in FIG. 3, the voltage amplitude of the AC input signal Vin may be changed. At a time, the distribution 100 of the tapping bandwidth along the driving voltage (input voltage Vin) may be obtained. The distribution 100 is slightly increasing as the driving voltage (input voltage Vin) increases. As the physical investigation, in the beginning stage, the attractive fore between contact tip 82 and the contact surface 62 is dominate. After a number of hitting on the contact surface 62, the invention has observed a phenomenon that the tapping bandwidth along the distribution 100 may suddenly, discontinuously jumps from the distribution 100 as the first stage to a distribution 102 as the second stage at the transition voltage at the path 104 at the first time in measurement.

The contact surface 62 may be regularly monitored at latter time such as few day, half month, or one month without specific set. The distribution of the tapping bandwidth is measured. However, the transition voltage may shift. As observed, and indicated by the arrow, the transition voltage would shift the path 106 after a certain period of time. The reason as investigated is that the contact surface 62 may become more dirty or sticky, which may be treated as an aging effect. Once the contact surface 62 become more sticky, the attractive force would be stronger, then the transition voltage would shift to a larger value.

As foregoing descriptions, the surface monitoring device 70 may be used to monitor the surface condition of the detected device 60. The contact surface 62 is the tested surface. The surface condition ate the contact surface 62 may also reflect the whole surface condition of the detected device 60.

Figure 6:
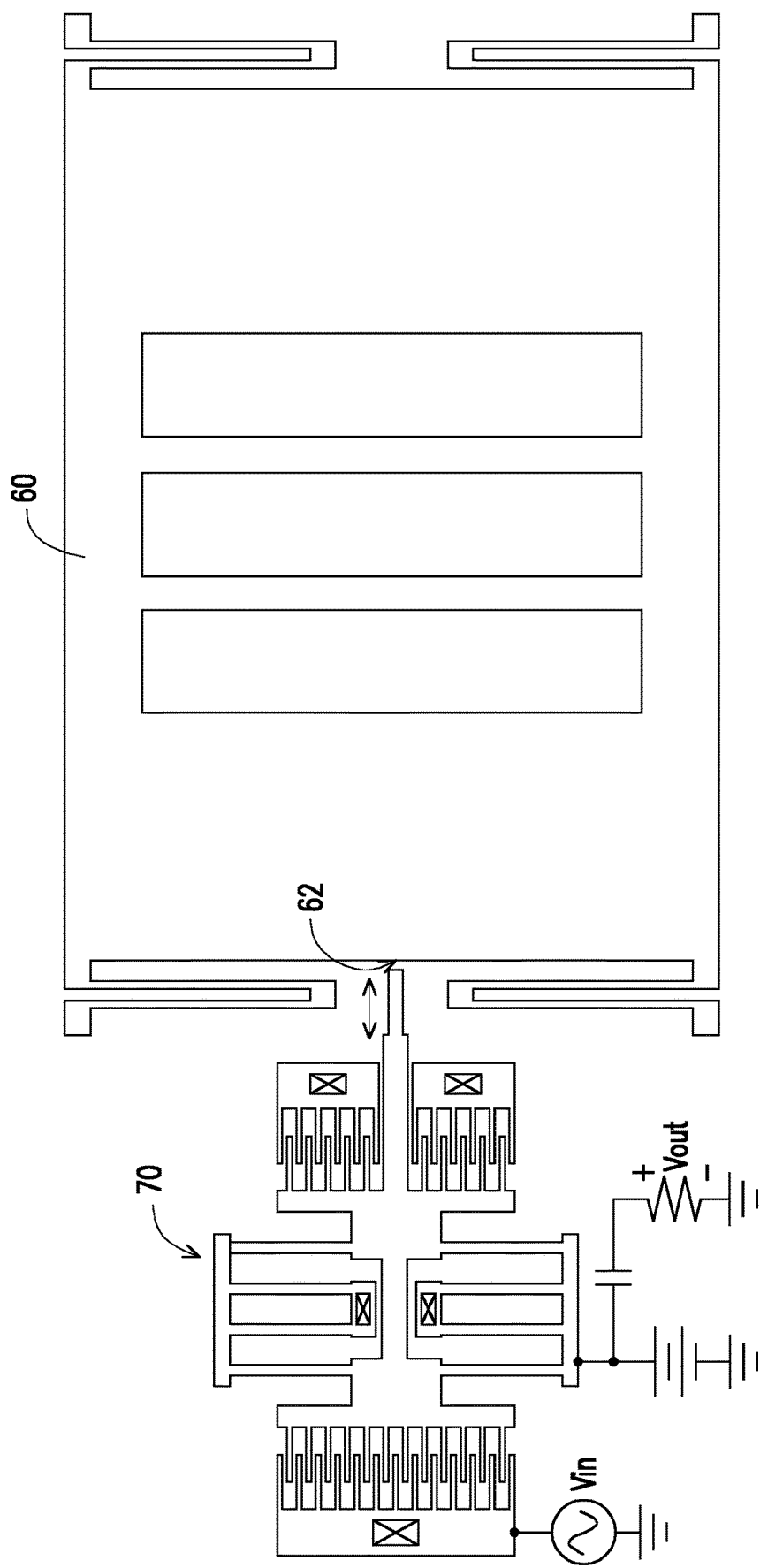
FIG. 6 is a drawing, schematically illustrating an implementation an apparatus with a surface monitoring device for monitoring a contact surface of a detected object at a top view, according to an embodiment of the invention.

FIG. 6 is a drawing, schematically illustrating an implementation an apparatus with a surface monitoring device for monitoring a contact surface of a detected object at a top view, according to an embodiment of the invention.

Referring to FIG. 6, a further application of the surface monitoring device in an embodiment is to monitor the MEMS inertial sensor, which is the detected device 60 in the embodiment. The MEMS inertial sensor as the detected device 60 may carry the mass objects and carry by spring. The surface monitoring device 70 is set adjacent to the MEMS inertial sensor to monitor the surface condition at the contact surface 62. Nevertheless, the surface monitoring device is not just be used to monitor the MEMS device.

In addition, the invention may also provide a method for monitoring a contact surface of a detected object. The method includes providing a surface monitoring device. The surface monitoring device and the detected object are disposed on a substrate. The surface monitoring device as provided includes: providing a resonant mechanical part, having a contact tip adjacent to the contact surface by a preset gap in a static state. In addition, a driving circuit is provided for applying an input signal of alternating current (AC) to drive the resonant mechanical part to cause the contact tip to vibrate with respect to the contact surface at a plurality of sampling frequencies, wherein the contact tip substantially hits the contact surface in a tapping bandwidth within the sampling frequencies. An analysis circuit is provided to analyze a ratio of an output voltage to an input voltage of the input signal and determine the tapping bandwidth, wherein the ratio in the tapping bandwidth is jumping to a flatten phase. The method also monitors the tapping bandwidth to determine a change of the contact surface in physical property.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A surface monitoring device for monitoring a contact surface of a detected object, the surface monitoring device and the detected object being disposed on a substrate, the surface monitoring device comprising:

a resonant mechanical part, having a contact tip adjacent to the contact surface by a preset gap in a static state;
a driving circuit, applying an input signal of alternating current (AC) to drive the resonant mechanical part to cause the contact tip to vibrate with respect to the contact surface at a plurality of sampling frequencies, wherein the contact tip substantially hits the contact surface in a tapping bandwidth within the sampling frequencies; and
an analysis circuit to analyze a ratio of an output voltage to an input voltage of the input signal and determine the tapping bandwidth, wherein the ratio in the tapping bandwidth is jumping to a flatten phase.

2. The surface monitoring device according to claim 1, wherein the driving circuit includes an input AC signal source with the sampling frequencies and an output path with a resistor, wherein a resonant current due to the resonant mechanical part flows through the resistor to provide the output voltage.

3. The surface monitoring device according to claim 1, wherein the resonant mechanical part includes a fixed part and a vibrating part, wherein a capacitance between the fixed part and the vibrating part is formed as the input signal is applied, wherein a vibration resonant occurs in the resonant mechanical part as the contact tip hits the contact surface.

4. The surface monitoring device according to claim 3, wherein the fixed part is a fixed beam and the vibrating part is an elastic beam with the contact tip.

5. The surface monitoring device according to claim 3, wherein the fixed part is a first comb-like electrode and the vibrating part includes a second comb-like electrode to form an interdigital electrode with respect to the fixed part, wherein the vibrating part further includes a spring part to support the second comb-like electrode.

6. The surface monitoring device according to claim 3, wherein the ratio jumps to a tapping region at a condition for the contact tip starts to hit the contact surface as the sampling frequencies from low to high, wherein the ratio jumps out the tapping region at a condition for the contact tip stops hitting the contact surface, a frequency size is determined as the tapping bandwidth.

7. The surface monitoring device according to claim 3, wherein the ratio is smooth increasing or decreasing as the sampling frequencies is out of the tapping region.

8. The surface monitoring device according to claim 1, wherein the detected object includes a micro-electro-mechanical-system (MEMS) initial sensor.

9. The surface monitoring device according to claim 1, wherein the driving circuit with the analysis circuit are configured to obtain a distribution of the tapping bandwidth with respect to a plurality of voltage amplitudes of the input signal.

10. The surface monitoring device according to claim 9, wherein the distribution of the tapping bandwidth discontinuously jumps from a first stage to a second stage at a transition voltage respectively corresponding to an attractive force dominate and a repulsive force dominate at the contact surface,
wherein a shift amount of the transition voltage in a time log determines a changes level of a sticky strength at the contact surface.

11. A method for monitoring a contact surface of a detected object, the method comprising:
providing a surface monitoring device, wherein the surface monitoring device and the detected object are disposed on a substrate and the surface monitoring device as provided includes:
providing a resonant mechanical part, having a contact tip adjacent to the contact surface by a preset gap in a static state;
providing a driving circuit, applying an input signal of alternating current (AC) to drive the resonant mechanical part to cause the contact tip to vibrate with respect to the contact surface at a plurality of sampling frequencies, wherein the contact tip substantially hits the contact surface in a tapping bandwidth within the sampling frequencies; and
providing an analysis circuit to analyze a ratio of an output voltage to an input voltage of the input signal and determine the tapping bandwidth, wherein the ratio in the tapping bandwidth is jumping to a flatten phase; and
monitoring the tapping bandwidth to determine a change of the contact surface in physical property.

12. The method according to claim 11, wherein the driving circuit as provided includes an input AC signal source with the sampling frequencies and an output path with a resistor, wherein a resonant current due to the resonant mechanical part flows through the resistor to provide the output voltage.

13. The method according to claim 11, wherein the resonant mechanical part includes a fixed part and a vibrating part, wherein a capacitance between the fixed part and the vibrating part is formed as the input signal is applied, wherein a vibration resonant occurs in the resonant mechanical part as the contact tip hits the contact surface.

14. The method according to claim 13, wherein the fixed part is a fixed beam and the vibrating part is a elastic beam with the contact tip.

15. The method according to claim 13, wherein the fixed part is a first comb-like electrode and the vibrating part includes a second comb-like electrode to form an interdigital electrode with respect to the fixed part, wherein the vibrating part further includes a spring part to support the second comb-like electrode.

16. The method according to claim 13, wherein the ratio jumps to a tapping region at a condition for the contact tip starts to hit the contact surface as the sampling frequencies from low to high, wherein the ratio jumps out the tapping region at a condition for the contact tip stops hitting the contact surface, a frequency size is determined as the tapping bandwidth.

17. The method according to claim 13, wherein the ratio is smooth increasing or decreasing as the sampling frequencies is out of the tapping region.

18. The method according to claim 11, wherein the detected object is a micro-electro-mechanical-system (MEMS) initial sensor.

19. The method according to claim 11, further the driving circuit with the analysis circuit in operation comprising applying the input signal with a plurality of voltage amplitudes in a range to obtain a distribution of the tapping bandwidth with respect to each of the voltage amplitudes.

20. The method according to claim 19, wherein the distribution of the tapping bandwidth discontinuously jumps from a first stage to a second stage at a transition voltage respectively corresponding to an attractive force dominate and a repulsive force dominate at the contact surface,
wherein a shift amount of the transition voltage in a time log determines a changes level of a sticky strength at the contact surface.

* * * * *